US007486437B2

(12) United States Patent
Ruschin et al.

(10) Patent No.: US 7,486,437 B2
(45) Date of Patent: Feb. 3, 2009

(54) APPARATUS AND METHOD FOR OPTICAL AMPLIFICATION IN INDIRECT-GAP SEMICONDUCTORS

(75) Inventors: Shlomo Ruschin, Herzliya (IL); Stanislav Stepanov, Tel Aviv (IL)

(73) Assignee: Ramot at Tel Aviv University Ltd., Tel Aviv (IL)

(*) Notice: Subject to any disclaimer, the term of this patent is extended or adjusted under 35 U.S.C. 154(b) by 0 days.

(21) Appl. No.: 10/577,858

(22) PCT Filed: Nov. 10, 2004

(86) PCT No.: PCT/IL2004/001027

§ 371 (c)(1),
(2), (4) Date: Apr. 28, 2006

(87) PCT Pub. No.: WO2005/045884

PCT Pub. Date: May 19, 2005

(65) Prior Publication Data

US 2007/0041086 A1    Feb. 22, 2007

(51) Int. Cl.
*H04B 10/17* (2006.01)
*H01L 31/0256* (2006.01)
(52) U.S. Cl. .................. 359/344; 438/29; 438/45
(58) Field of Classification Search ........... 359/344; 438/29, 45
See application file for complete search history.

(56) References Cited

U.S. PATENT DOCUMENTS 3,761,837 A * 9/1973 Leheny et al. ......... 372/43.01

2002/0048289 A1    4/2002  Atanackovic et al.
2003/0142943 A1 *  7/2003  Yegnanarayanan et al. .. 385/131

OTHER PUBLICATIONS

Alexander Torchigin and Sergey Torchigin, "One dimensional inhomogeneous photonic bandgap structures based on tapered fibers," j. Opt. A: Pure Appl. Opt. (2002) 274-282.22 (Mar. 11, 2002).
W. Both, R. Rimpler. "Effect of Homogeneous Stress and Temperature Distribution in A Laser Diode on the Pulsation" pp. 330-332. Nov. 5, 1990.
Pierre Muret and Christopher Saby. "Band Bending, electronic affinity and density of states at several (100) surfaces of a boron-doped homoepitaxial Diamond Thin Films", p. 1-7. Sep. 30, 2003.

(Continued)

*Primary Examiner*—Eric Bolda
(74) *Attorney, Agent, or Firm*—Mark M. Friedman

(57) ABSTRACT

Methods and corresponding apparatus for optical amplification in semiconductors, particularly indirect band-gap semiconductors, and most particularly in silicon. A first aspect of the invention employs certain doping elements to provide inter-band-gap energy levels in combination with optical or current-injection pumping—The doping element, preferably a noble metal and most preferably Gold, is chosen to provide an energy level which enables an energy transition corresponding to a photon of wavelength equal to the signal wavelength to be amplified. The energy transition may be finely "adjusted" by use of standard doping techniques (such as n-type or p-type doping) to alter the conduction and valence band energy levels and thereby also the magnitude of the energy transition. A second aspect of the invention relates to the use of a non-homogeneous heat distribution which has been found to lead to optical amplification effects.

20 Claims, 9 Drawing Sheets

OTHER PUBLICATIONS

Mark Csele Fundamentals of Light Sources and Lasers. Copyright 2004 John Wiley & Sons, Inc. pp. 117-158, 2004.

"Temperature Dependence of the Indirect Energy Gap in Crystalline Silicon" V. Alex, S.Finkbeiner, J. Weber, J. Appl. Phsy. 79, p. 6943 (1996).

"Gaining Light From Silicon," Leigh Canham; Nature, , vol. 408, pp. 411-412 (2000).

"Infrared to Visible Up-Conversion Using GaP Light-Emitting Diodes" W. Eisfeld, U. Werling, and W. Prettl, Appl. Physics Lett. vol. 42, pp. 276-278 (9183).

"Optical Absorption Coefficient of Silicon et al"; G.E. Jellison. Kr. Lowndes. D.H. Lowndes, Appl. Phsy. Lett. vol. 47; p. 594 (1982).

"Gasdynamic Lasers" S.A. Losev, (Springer-Verlag Berlin, 1981).

"Applied Physics Letter" R. Normandin, D.C. Houghton M. Simard-Normandin, and Y. Zhang. Canadian. Journal of Phys. 66, 833 (1988).

L. Pavesi, Proceeding of SPIE—vol. 4997, 206-220 (2003) ' A Review of Various Approaches to Silicon Laser.

Book by J.F. Ready, "Effect of High-Power Laser Radiation" (Academic Press, 1971).

Modulation of Light by Light in Silicon-on-Insulator Waveguides; Appl. Physics Lett. vol. 83. No. 25, pp. 5151-5153 (2003); S. Stepanov and S. Ruschin.

Book by ; S.M. Sze, Physics of Semiconductor Devices, $2^{nd}$ Ed.) (New York: Wiley 1981).

Optical Gain in Material With Indirect Transitions; T. Trupke, M.A. Green and P. Wurfel; Journal of Applied Physics vol. 93, No. 11, pp. 9058-9061 (2003).

"Influence of pn Junction Formation et al." Physical Review B, vol. 64, 132202-1-033202-4 (2001), by B.J. Pawlak and N.Q. Vinh, T. Gregorkiewicz and K. Thonke.

"Generation, Amplification and Detection of Infra and Optical et al." N.G. Basov, O.N. Krokhin and Yu M. Popv, Sov Phys. vol. 3, No. 5 JETP 13, 845 (1961).

"Stimulated Raman Scatterin in Silicon Waveguides", R. Claps, D. Dimitropolous, B. Jalali,, Electron. Lett. 38, 1352 (2002).

"Coefficient Determiniation Related to Optical Gain et al."; Hak-Seung Han, Se-Young Seo, Shin JH, Namkyoo Part, Appl. Phys. Lett. vol. 81, No. 20, 3720-3722 (2002).

"Nanosecond Laser Amplification Via Degenerate Multiwave Mixing et al." I.C. Khoo, R. Normandin, Appl. Phys. Lett vol. 52, p. 525 (1988).

"Photoluminescence From Gold Centre in Silicon" J. Mazzaschi , J.C. Brabant, B. Brousseau, J. Barran, J. Brousseau, F. Voillot and P. Bacuvier, Solid State Communications, vol. 39, Issue 10, pp. 1091-1092.

"Light-Induced Radiative Recombination Centers et al." J.I. Pankove and J.E. Berkeyheiser, Appl. Phys. Rev. B, vol. 37(8), pp. 705-706 (1980).

Radiation Damage and Defects in Semiconductors: proceedings of the International Conference Organized by the Institute of Physics, held at the Univ. of Reading (1972) ; Author: Whitehouse, J.E.

Dislocation -Related Photoluminescence in Silicon, R. Sauer, J. Weber, J. Stolz. E.R. Webek,K-H Kusters, and H.Alexander, Appl. Phys. A, vol. 36, No. 1, pp. 1-13 (1985).

"Silicon Temperature Measurement by Infrared Absorption et al." J.C. Strum , C.M. Reeves, IEEE Trans. On Electron Devices vol. 39, No. 1, p. 81 (1992).

"Emissivity of Silicon at Elevated Temp.", P.J. Timans, J. Appl. Phys. , vol. 74 (10) , p. 6353-6364 (1993).

"Electrical and Optical Properties fo Gold-Doped n-type Silicon", H. Weman, A. Henry, T. Begum, B. Monemar, O.O. Awadelkarim and J.L. Lindstrom, J. Appl. Phys. vol. 65 (1) pp. 137-145 (1989).

* cited by examiner

APPARATUS AND METHOD FOR OPTICAL AMPLIFICATION IN INDIRECT-GAP SEMICONDUCTORS

FIELD AND BACKGROUND OF THE INVENTION

The present invention relates to optical amplification and, in particular, it concerns optical amplification in semiconductors, particularly silicon, by optical pumping and/or non-homogeneous heating.

There is presently a great deal of interest in the pursuing of semiconductors as basic materials for lasers and optical amplifiers for optical networks. Most of existing semiconductor lasers and amplifiers are based on direct band gap semiconductor materials. At present, Silicon is not considered a favorable candidate for these applications, by virtue of indirect band gap structure. On the other hand, light stimulated emission properties of GaP, also an indirect band-gap semiconductor has been reported and light-emitting diodes (LEDs) based on this material are commercially available [1]. Regarding doped Silicon, a massive effort in order to develop lasers and amplifiers is taking place these days worldwide (see Refs. [2, 3] for a review on the subject).

Experimental observation of the stimulated emission in bulk Silicon was not reported to-date to the best of our knowledge [4], since Basov, et al [5], and recently Trupke, et al [6] theoretically predicted this possibility.

Reports on gain included $Er^+$-doped silicon and silicon dioxide structures [7] and structures not based on the original crystalline structure (nano-crystals, nano-layers etc) [2]. Gain was also attained via non-linear processes e.g. stimulated Raman scattering [8] and multiwave mixing [9], the mechanisms present in many materials. Our main goal here is the disclosure of methods for attaining stimulated emission in Silicon. Stimulated emission is in the essence of laser action or optical amplification of light signals.

SUMMARY OF THE INVENTION

The present invention provides two independent methods that can be applied for developing of silicon based optical amplifiers and lasers. First is based on the photons stimulated emission that is the result of free carriers recombination via impurities (recombination centers, traps) in forbidden band gap. The second method of generation of the photon's stimulated emission is based on the non-homogeneous heating of direct gap or indirect band gap semiconductor materials. Optionally, the two methods may be employed simultaneously to advantage.

According to the teachings of the present invention there is provided, a method for achieving optical amplification of an optical signal passing through a semiconductor, the method comprising the steps of: (a) providing a semiconductor material, the semiconductor material having a given band gap energy at a given temperature; (b) heating the semiconductor material so as to raise at least a portion of the semiconductor material to a temperature such that the band gap energy in the portion is smaller by at least 5% than the band gap at the given temperature, the heating being performed so as to generate an inhomogeneous temperature distribution within a target volume of the semiconductor; and (c) directing the optical signal through the target volume.

There is also provided according to the teachings of the present invention, an apparatus for achieving optical amplification of an optical signal, the apparatus comprising: (a) a body of semiconductor material including a target volume, the semiconductor material having a given band gap energy at room temperature; (b) a heating arrangement operatively associated with the body of semiconductor material for raising at least a portion of the semiconductor material to a temperature such that the band gap energy in the portion is smaller by at least 5% than the band gap at the given temperature, the heating being performed so as to generate an inhomogeneous temperature distribution within a target volume of the semiconductor; and (c) an optical arrangement for directing an optical signal through the target volume.

According to a further feature of the present invention, the semiconductor material is an indirect band-gap semiconductor material, and most preferably silicon.

According to a further feature of the present invention, the heating is performed so as to raise at least a portion of the semiconductor material to a temperature in the range of between 200° C. and 1000° C. above an ambient temperature.

According to a further feature of the present invention, the heating is performed so as to raise at least a portion of the semiconductor material to a temperature such that the band gap energy in the portion is smaller by at least 10% than the given band gap energy.

According to a further feature of the present invention, the heating is performed by directing laser radiation onto a region of the semiconductor material.

According to a further feature of the present invention, the laser radiation is directed onto a region of the semiconductor material coated with a compound having lower reflectivity than an exposed surface of the semiconductor material.

According to a further feature of the present invention, the optical signal is directed into a region of the semiconductor material coated with a compound having higher reflectivity than an exposed surface of the semiconductor material so as to cause reflection of the optical signal so as to pass through the target volume a plurality of times.

According to a further feature of the present invention, the heating is performed by directing a source of microwave radiation into a region of the semiconductor material.

According to a further feature of the present invention, the heating is performed by directing heat from a non-coherent light source onto a region of the semiconductor material.

According to a further feature of the present invention, the heating is performed by passing an electric current through a resistive load associated with the semiconductor material.

According to a further feature of the present invention, at least the target volume of the semiconductor forms part of an optical waveguide, the step of directing the optical signal being performed by directing the optical signal along the optical waveguide.

According to a further feature of the present invention, the semiconductor material is silicon doped with at least one element chosen from the group comprising: Gold, Silver, Platinum, Iron, Copper, Zinc, Cobalt, Tellurium, Mercury, Nickel, Sulfur and Manganese.

There is also provided according to the teachings of the present invention, a method for achieving optical amplification of an optical signal passing through indirect-gap semiconductor, the method comprising the steps of: (a) providing a body of the indirect-gap semiconductor doped with at least one element so as to generate at least one added energy level at a known energy lying within the energy band-gap of the semiconductor, the added energy level enabling an energy transition between the added energy level and an energy band of the semiconductor corresponding to generation of a photon of a given wavelength; (b) irradiating a target region of the body of semiconductor with optical illumination of a wavelength shorter than the given wavelength; and (c) directing an optical signal of the given wavelength through the target region.

According to a further feature of the present invention, the illumination has a wavelength no greater than a wavelength of a photon corresponding to the transition between the conduction gap and the valence band in the semiconductor.

According to a further feature of the present invention, the at least one element is chosen from the group comprising: Gold, Silver, Platinum, Iron, Copper, Zinc, Cobalt, Tellurium, Mercury, Nickel, Sulfur and Manganese. More preferably, the at least one element is chosen from the group comprising: Gold, Silver and Platinum. Most preferably, the at least one element includes Gold.

According to a further feature of the present invention, the given wavelength is in the range of 1.2-2.2 micrometers.

According to a further feature of the present invention, the irradiating is performed using a pulsed laser source.

According to a further feature of the present invention, the irradiating is performed using a substantially continuously irradiating laser source.

According to a further feature of the present invention, the target region lies at least partially in an optical waveguide formed in the body of semiconductor.

According to a further feature of the present invention, the indirect-gap semiconductor is silicon.

There is also provided according to the teachings of the present invention, a method for achieving optical amplification of an optical signal passing through an indirect-gap semiconductor, the method comprising the steps of: (a) providing a body of the indirect-gap semiconductor doped with at least one element so as to generate at least one added energy level at a known energy lying within the energy band-gap of the semiconductor, the added energy level enabling an energy transition between the added energy level and an energy band of the semiconductor corresponding to generation of a photon of a given wavelength; (b) performing current injection into at least a target region of the body of semiconductor; and (b) directing an optical signal of the given wavelength through the target region.

According to a further feature of the present invention, the at least one element is chosen from the group comprising: Gold, Silver, Platinum, Iron, Copper, Zinc, Cobalt, Tellurium, Mercury, Nickel, Sulfur and Manganese.

According to a further feature of the present invention, the indirect-gap semiconductor is silicon.

BRIEF DESCRIPTION OF THE DRAWINGS

The invention is herein described, by way of example only, with reference to the accompanying drawings, wherein:

FIG. 6 shows signal transmissions for different pump powers and different lateral spatial positions of signal relative to pump spot wherein:

Figure 7:
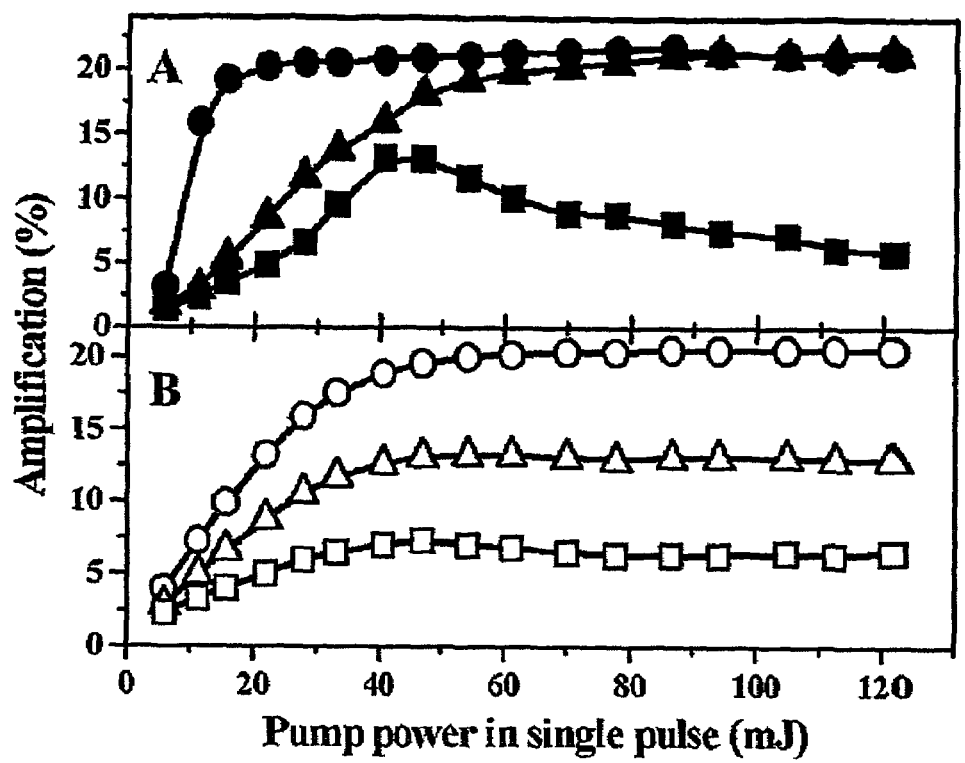
Figure 8:
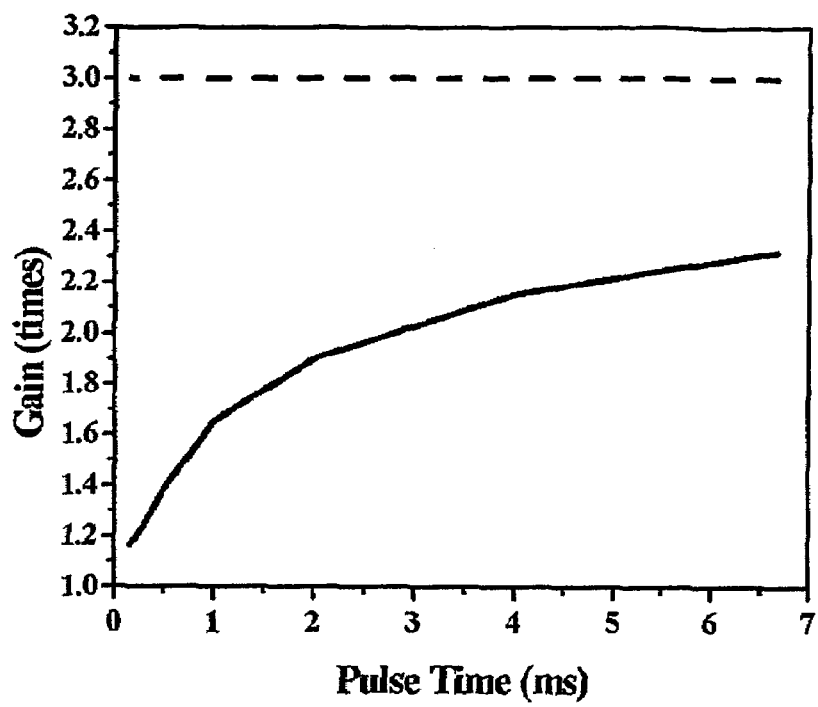
Figure 9:
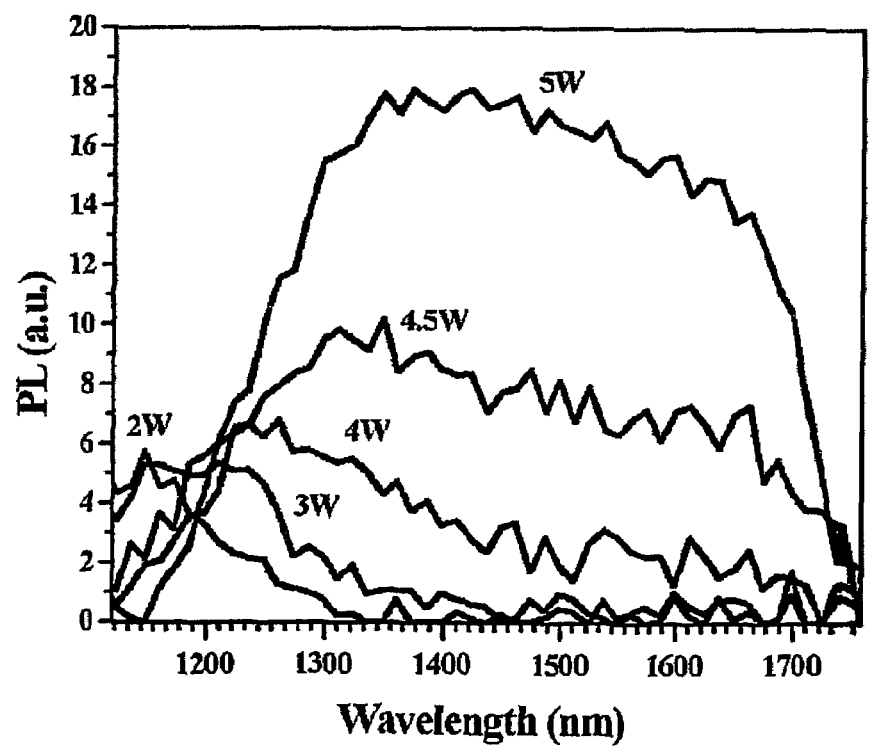
Figure 10:
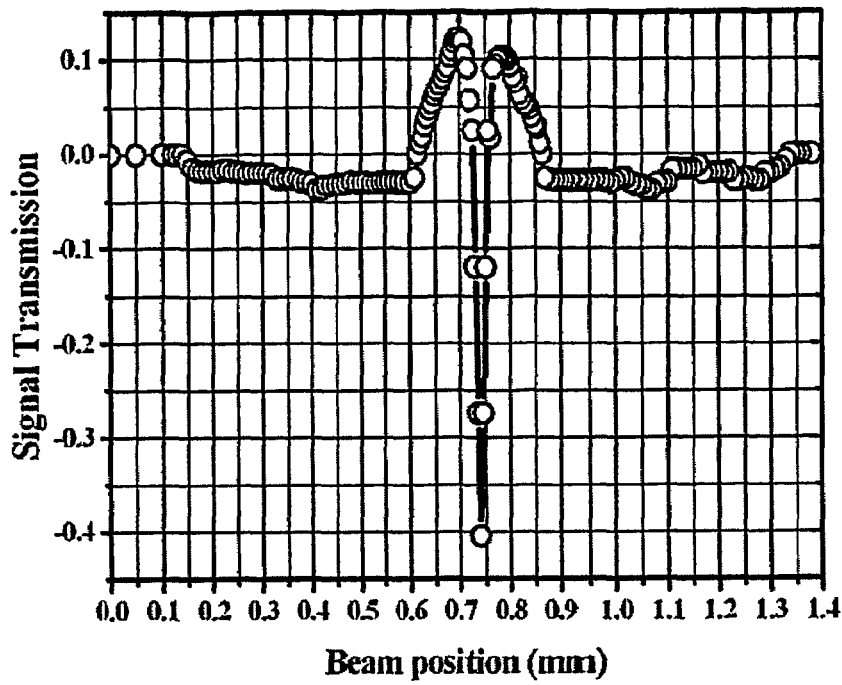
Figure 11:
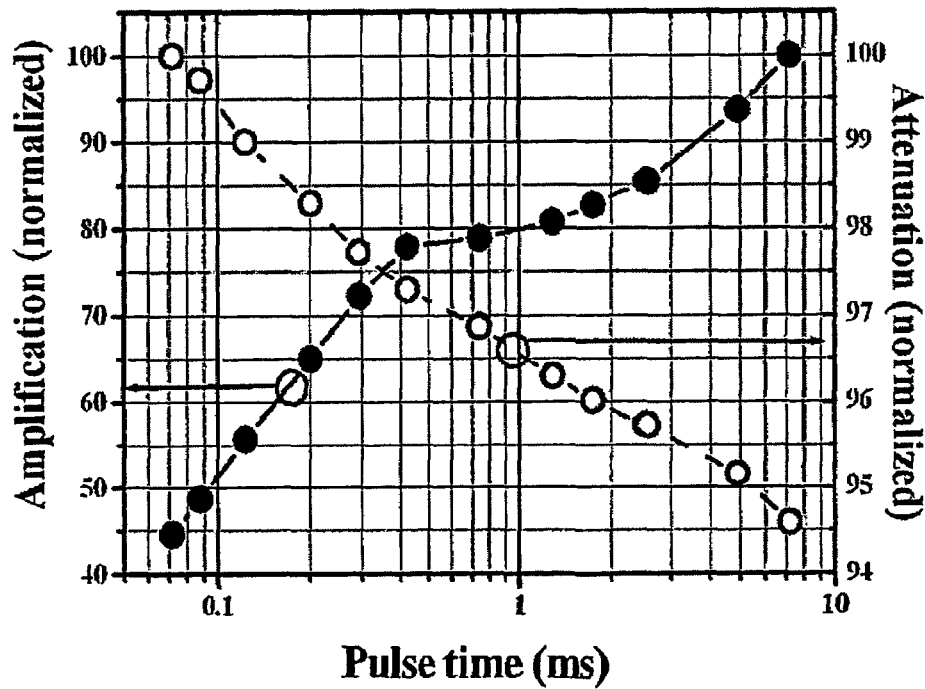
Figure 12A:
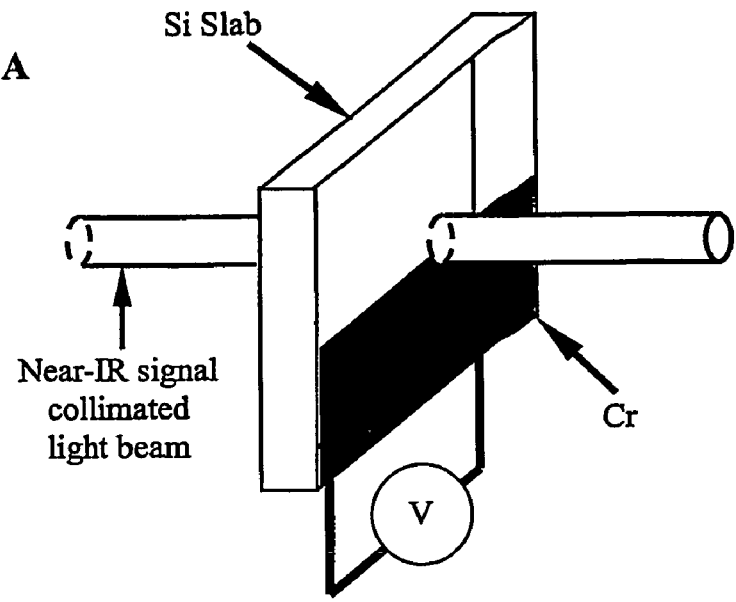
Figure 12B:
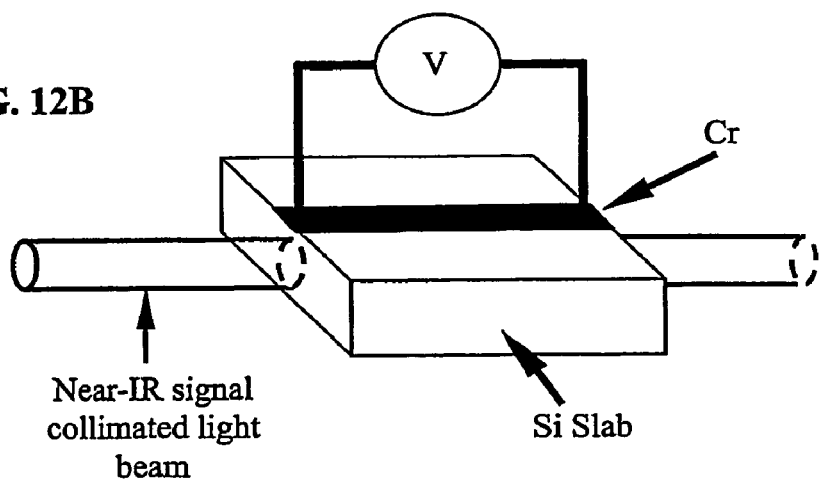
Figure 13:
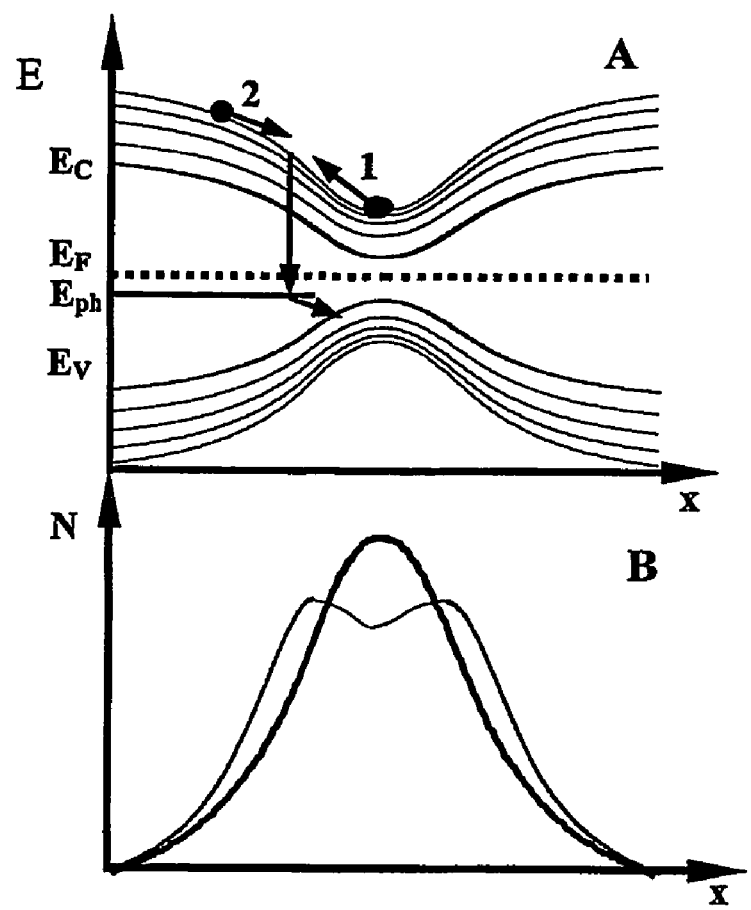

Oscillogram (a) shows transmission of a 1.51 μm-wavelength signal through a 0.37-mm thick silicon sample with antireflective coating that was edge pumped at 15 mJ-power in single pulse; lines are: (1) signal with pumping, (2) signal with silicon slab removed, and (3) pump laser trace; and Oscillograms (b)-(e) show low coherence (spontaneous light emission from an EDF) 1.5 μm-wavelength signal transmissions though 1-mm thick silicon sample that was pumped at the same side and for different space positions, and pump power, namely: (b), and (c)—original position, pump power was 40 mJ/pulse, and 160 mJ/pulse respectively; (d), and (e)—pump power was 40 mJ/pulse, and moving of the signal beam position were 0.8 and 1.28 mm, respectively;

FIG. 7 shows dependence of the optical gain on pump power for different signal sources and different silicon samples wherein:

Curves of figure (A) show light amplification for 0.37-mm-thick n-type (~5 Ωcm) phosphorus-doped Silicon sample with SiO antireflective coating: circles are for EDF spontaneous light emission, triangles for 1.54-μm laser, and squares for 1.3-μm laser sources;

Curves of figure (B) show light amplification for EDF source used as signal: hollow circles are for 1-mm-thick phosphorus-doped (~50 Ωcm), hollow triangles for 0.5-mm-thick boron-doped (~50 Ωcm), and hollow squares for 0.37-mm-thick n-type (~5 Ωcm) phosphorus-doped silicon samples;

FIG. 8 is a graph showing the maximum gain in quasi-CW irradiated samples, as a function of pump/heating pulse duration wherein the dotted line is for continuous laser excitation and the pump power for both measurements was kept constant at 5 Watt;

FIG. 9 shows luminescence spectra for different light pump power;

FIG. 10 shows the dependence of a reference light signal transmission on position of a pump spot relative to a waveguide;

FIG. 11 shows the dependence of an amplification and attenuation of the infrared light signal on pump pulse time in SOI-based waveguides, wherein solid circles show signal amplification when pump spot was moved from waveguide center to a few tens microns and hollow circles show signal attenuation when pump spot was centered on waveguide;

FIGS. 12A and 12B show two preferred schemes for non-homogeneous heating of silicon samples by a resistive load applied to the silicon; and FIG. 13 shows graphs illustrating: (A) energy states deformation in local heated semiconductor material (shown as discrete states for illustration purposes); and (B) schematic distribution of intrinsic and non-equilibrium carrier densities following local heating.

DESCRIPTION OF THE PREFERRED EMBODIMENTS

The present invention relates to methods and corresponding apparatus for achieving optical amplification in semiconductors, particularly indirect band-gap semiconductors, and most particularly in silicon. A first aspect of the invention relates to the use of certain doping elements to provide interband-gap energy levels in combination with optical and/or current-injection pumping. The doping element, preferably a noble metal and most preferably Gold, is chosen to provide an energy level which enables an energy transition corresponding to a photon of wavelength equal to the signal wavelength to be amplified. The energy transition may be finely "adjusted" by use of standard doping techniques (such as n-type or p-type doping) to alter the conduction and valence band energy levels and thereby also the magnitude of the energy transition. A second aspect of the invention relates to the use of a non-homogeneous heat distribution which has been found to lead to optical amplification effects.

Figure 2:
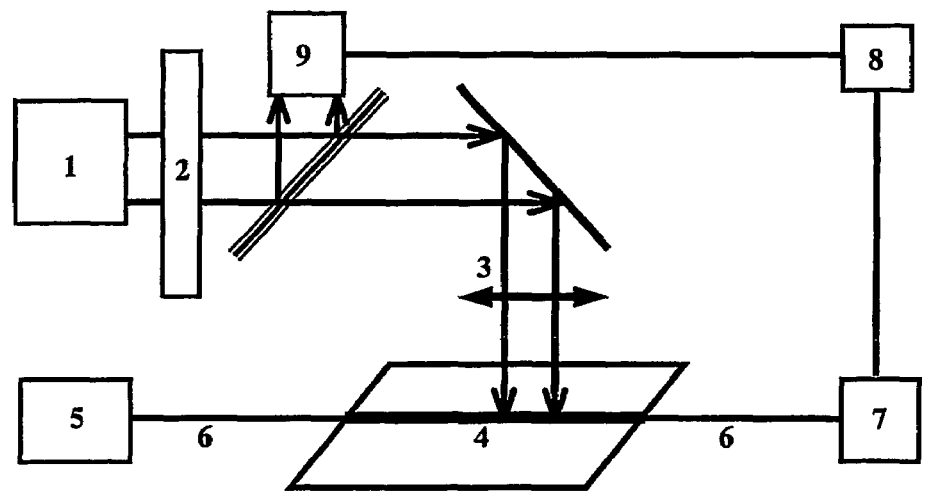
FIG. 2 is an experimental set-up used for measurements of light amplification.

Thus, in general terms, the apparatus for light-pumped amplification constructed and operative according to the teachings of the present invention as shown in FIG. 2 includes a body of silicon doped with at least one element so as to generate at least one added energy level at a known energy lying within the energy band-gap of the silicon, the added energy level enabling an energy transition between the added energy level and an energy band of the silicon corresponding to generation of a photon of a given wavelength. The apparatus further includes a first optical arrangement for irradiating a target region of the body of silicon with optical illumination of a wavelength shorter than the given wavelength, and a second optical arrangement for directing an optical signal of the given wavelength through the target region.

The first optical arrangement preferably illuminates with radiation having a wavelength no greater than a wavelength of a photon corresponding to the transition between the conduction gap and the valence band in the silicon. The first optical arrangement preferably includes a pulsed laser source. Alternatively, a substantially continuously irradiating laser source (i.e., either with continuous output or high duty-cycle pulses approaching continuous output) may be used.

The at least one element is chosen from the group comprising: Gold, Silver, Platinum, Iron, Copper, Zinc, Cobalt, Tellurium, Mercury, Nickel, Sulfur and Manganese. More preferably, a noble metal (Gold, Silver or Platinum) is used, and most preferably, Gold.

Most preferably, the primary doping element is chosen, optionally together with a secondary doping element for modifying the conduction and/or valence band energy levels of the semiconductor, so as to achieve optical amplification for wavelengths in the near infrared range, a preferred range being between 1.2 and 2.2 micrometers.

The target region within which amplification occurs is most preferably at least partially within an optical waveguide formed in the body of silicon.

Figure 5A:
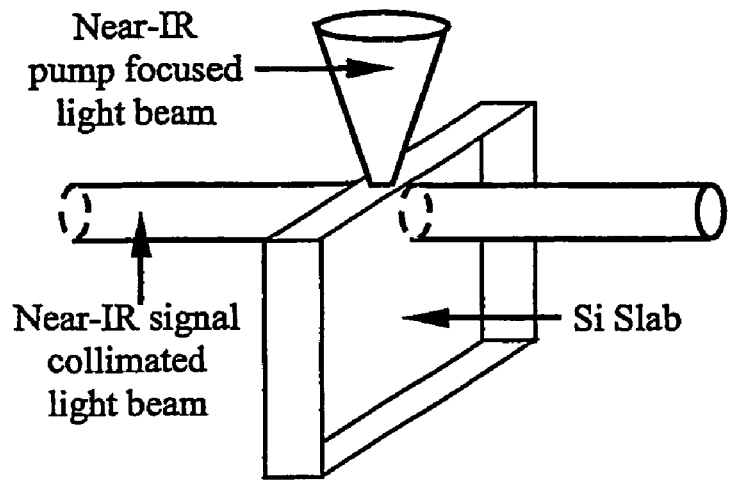
FIG. 5A illustrates schematically an apparatus according to a second aspect of the present invention for delivering heating power for a sample irradiated at the edge by a focused laser beam.
Figure 5B:
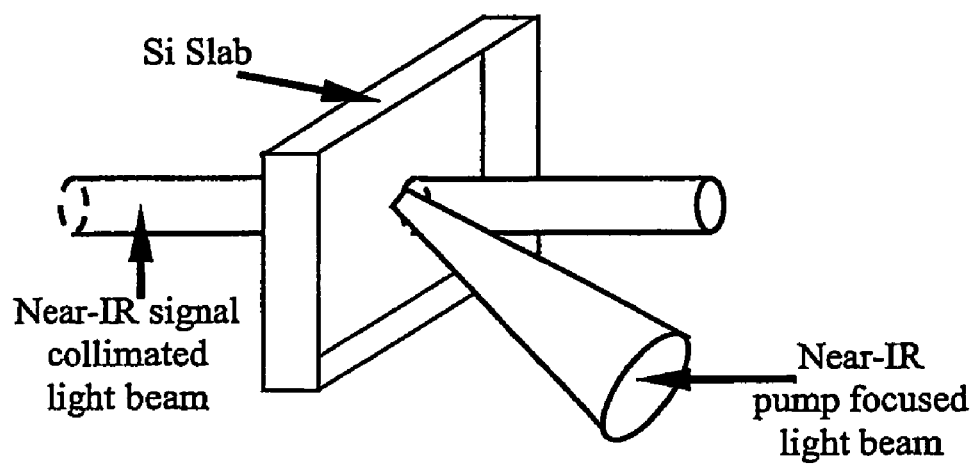
FIG. 5B is similar to FIG. 5A, but illustrates an on-plane laser heating power delivery scheme.

Further in general terms, the optical amplification apparatus according to the second aspect of the present invention as exemplified in FIGS. 5A and 5B includes a body of semiconductor material including a target volume, the semiconductor material having a given band gap energy at room temperature. A heating arrangement is deployed to raise at least a portion of the semiconductor material to a temperature such that the band gap energy in the portion is smaller by at least 5% (and more preferably by at least 10%) than the given band gap energy, the heating being performed so as to generate an inhomogeneous temperature distribution within a target volume of the semiconductor. An optical arrangement directs an optical signal through the target volume to achieve optical amplification.

This aspect of the present invention relates primarily, although not exclusively, to indirect band-gap semiconductor materials, and most preferably silicon. It should be noted that the term "silicon" is used herein in the description and claims, unless otherwise specified, to refer generically to pure silicon crystals and silicon doped with various elements as is known in the art. In the case of silicon, the preferred range of working temperatures for the maximum temperature of the heated region is between 200° C. and 1000° C. In certain cases, a maximum temperature in the range of 400° C. to 800° C. may be advantageous.

The heating arrangement may take a number of different forms. According to a first preferred option, the heating arrangement includes a laser for directing radiation onto a region of the body. Optionally, a reduced reflectivity compound may be coated onto a region of the semiconductor material to increase absorption. A second option for the heating arrangement is a source of microwave radiation configured for directing microwave radiation into a region of the body. A third option employs an arrangement for directing heat from a non-coherent light source, such as an incandescent lamp or from sunlight, onto a region of the semiconductor material. A fourth option includes an electric circuit for passing an electric current through a resistive load associated with the body. In the latter case, the resistive load may be within, deposited onto, or located in proximity to, the semiconductor. Certain examples will be discussed below with reference to FIGS. 12A and 12B.

Optionally, the optical signal may be directed into a region of the semiconductor material coated with a compound having higher reflectivity than an exposed surface of the semiconductor material so as to cause reflection of the optical signal so as to pass through the target volume a plurality of times. This enhances the amplification effect and may be used to construct a laser.

Most preferably, the target volume forms part of an optical waveguide formed in the body of semiconductor material. In this case, the optical arrangement includes an optical interface for introducing the optical signal into the optical waveguide.

Optionally, the non-homogeneous heating mechanism may be implemented with silicon doped with Gold. In this case, a synergic combination of the two effects described herein may advantageously be achieved.

These and other features of the present invention will now be described further with reference to the accompanying drawings.

A. Trap Assisted Stimulated Emission in Silicon

A.1. Introduction

As is well known, Shockley-Read-Hall (SRH) and Auger recombination are dominant recombination mechanisms in Silicon. SRH recombination (recombination via deep energy levels in Silicon forbidden gap due to sample deformations, doping, etc.) can enhance radiative recombination. The energy level of impurities or other faults will determine the wavelength of the luminescence. Therefore controlled insertion of doping type, traps, or recombination centers can allow the luminescence at specific wavelength. Moreover, if carriers lifetime in a lower energy level, where there is recombination of the free electrons and holes, is less then that of an upper energy level (capture center, conduction band, etc.) it would be possible to realize optical amplification or laser action at specific wavelength.

In this work, we disclose and report the use of Silicon as basic material for lasers and optical amplifiers manufacturing, able to operate at different wavelengths. Free carriers can be generated by applying optical pumping, current injection, electrical field (impact ionization mechanism), or combination of optical pumping with electrical field, and by heating of the sample.

Radiative recombination mechanisms for Silicon are still not fully clarified in some cases. But most of authors agree that luminescence in Silicon is a result of the presence of impurities or faults, that create energy levels which are situated in the forbidden band. The impurities can be acquired due to deformation of the silicon sample, or doping of the material. For example, Sauer, et al [10] observed dislocation-related photoluminescence in Silicon. Recombination centers were obtained by temperature deformation of Silicon samples with different types and concentrations of the doping. Measured photoluminescence spectra ranged from 1.1 to 1.7 μm wavelengths. Several researchers observed trap assisted luminescence in silicon after irradiation of the one by electron and proton beams, x and y rays [11], high power laser beam [12] at that, the luminescence spectra were not equaled to silicon band gap value. Luminescence that is due to a doping insertion was observed for gold [13, 14] and silver [15] doped Silicon, as well. In addition, luminescence radiation spectra were well matched with familiar data of the energy level positions for these metals in Silicon forbidden band, specifically, 0.35 eV and 0.34 eV above the conduction band, for gold and for silver respectively. Tab.1 [16] shows several materials that create energy states in the silicon forbidden gap, which can be involved in stimulated emission process:

TABLE 1

| Metal | Energy of the state in eV | Photon wavelength μm |
|---|---|---|
| Electron recombination from Conductive band to Dope energy state with photon creation | | |
| Fe | 0.4 | 1.72 |
| Au | 0.35 | 1.61 |
| Ag | 0.34 | 1.59 |
| Cu | 0.24 | 1.41 |
|  | 0.37 | 1.65 |
| Zn | 0.31 | 1.53 |
|  | 0.55 | 2.1 |
| Co | 0.39 | 1.7 |
| Tl | 0.26 | 1.44 |
| Hg | 0.36 | 1.63 |
| Electron recombination from Dope energy state to Valence band with photon creation | | |
| Ag | 0.33 | 1.57 |
| Ni | 0.35 | 1.61 |
| S | 0.37 | 1.65 |
|  | 0.18 | 1.32 |
| Mn | 0.53 | 2.1 |
| Fe | 0.55 | 2.1 |
| Pt | 0.37 | 1.65 |
| Hg | 0.33 | 1.57 |

It should be note that, wavelength of luminescence and stimulated light emission (optical amplification, lasing) can been changed for heated samples. No proved method insofar has been given to attain optical amplification at near-infrared wavelength using doped silicon excepting rare-earth metals such as Erbium where the properties are attributable to internal energy levels of the metals themselves.

A.2. Theoretical Background

Figure 1:
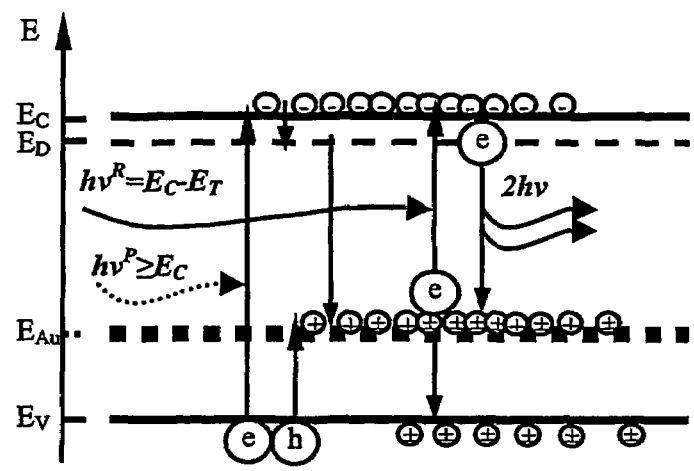
FIG. 1 is a schematic illustration of a hypothetical mechanism of light amplification in Gold-doped Silicon.

FIG. 1 shows one plausible energy diagram for Gold diffused Silicon, which could account for optical signal amplification. This diagram and model is in accordance with observations of Mazzaschi et al [13] who reported luminescence from gold-doped Silicon at photon energies around 0.78 eV and 0.793 eV below the conduction band, very close to the energy of the photons for which we observed amplification. This diagram includes, in addition to the band structure of Silicon, an recombination center at around 0.32 eV above the Valence Band ($E_{Au}$) this level is result of Gold atoms presence in silicon. We add to the model an additional energy state of energy $E_D$, which is created by phosphorous doping, close and below the conduction band.

Let's assume that the Silicon sample is illuminated by light pump pulse with photon energy more or equal than the Silicon band gap. Then, electrons will come over from valence to conductive band. During and after the pump light pulse, electrons are recombined by both non-radiative means (Auger and phonon band-to-band recombination mechanism or via any other traps) and the specific radiative transition via the Gold-related recombination center. If a reference signal of infrared light with photon energy equal to difference between energy position of the Gold recombination center and conduction band or donor energy level ($E_C$ or $E_D$)−$E_{Au}$=$h\nu_{Ref}$) passes through the illuminated by pump sample, the captured electrons in the recombination center can relax back to the conductive band. As is well-known, free carriers lifetime is reduced with introducing of Gold in Silicon, therefore we can assume that the free carriers lifetime in recombination center is less then in conductive band. Then, there would be a possibility of stimulated emission in Gold doped Silicon. The presence of a trap at energy $E_D$ of longer lifetime than the conductive band, would favor population inversion and gain. Analogous reasoning would be valid for Silicon with any other dope impurities that were presented in Tab.1. We presented that model as a plausible explanation for the amplification phenomenon we observed, and are aware that other models for explaining it are possible.

A.3. Experimental Details

For testing of our assumption, namely: optical amplification in gold-doped silicon, we used low Phosphorous-doped (N≈$10^{13}$ bond and etchback—Silicon-on-Insulator (BESOI) wafers which were manufactured by Shin-Etsu Handotai Co., Ltd. with following geometrical specification: top SOI layer had 5-μm thickness and silicon dioxide buffer layer was 0.5-μm.

Gold was thermally diffused in top layer of the SOI wafer at different temperature regimes and diffusion times at room atmosphere and pressure. Thickness of the sputtered gold layer was about 1500A. Diffusion times for separated samples ranged from 30 minutes to 7 hours in 30 minutes steps. Diffusion temperature was varied from 550 to 750° C. in 50° C. step for different samples. For some samples we applied fast heating and cooling. Residuary undiffused gold was removed by $3HCl:1HNO_3$ mixture.

After the process the samples were dry oxidized on 0.5-μm silicon dioxide layer. The process was useful for smoothing of the surface roughness and for elimination of the surface recombination centers.

Next step was waveguide manufacturing. After photolithography process, silicon dioxide was dry etched. Top silicon was wet etched by $72HNO_3:8HF: 20CH_3COOH$ mixture on 1.5-μm Both faces of the samples were cleaved. The length of the prepared waveguides was about one centimeter.

FIG. 2 shows the experimental set-up used to demonstrate the invention, and the corresponding apparatus. Briefly stated, the elements shown are: 1) 0.532 mm wavelength pump laser source; 2) mechanical chopper; 3) cylindrical lens; 4) SOI based single-mode waveguide; 5) 1.32 mm or 1.55 mm wavelength reference laser sources; 6) single-mode fibers; 7) fast infrared photoreceiver; 8) oscilloscope; 9) fast visible light photoreceiver. Second harmonic of a CW Nd:YAG laser ($\lambda$=532 nm) was chosen as pumping light source. The diameter of the output laser beam was 3-mm, and a cylindrical converging lens with an 18-mm focal length was used for increasing the incident power density of the pumping light at the sample, down to about a width of 10 µm. Light pump power which illuminated the 10 µm width waveguide ranged from 10 mW to 1.5W. A mechanical chopper with 20% duty cycle and frequencies ranging from 1 Hz to 1 KHz was used for modulation of the pumping light. The reference infrared light source was tunable laser, ranging in wavelengths between 1.527 and 1.576 µm, to provide the optical signal for amplification. The signal source was coupled-in into the waveguide by means of a single-mode fiber. Light coming out from the waveguide was directed into a fast IR photoreceiver by an optical fiber. The amplitude changing of the infrared light was measured by oscilloscope.

A.4. Experimental Results

Figure 3:
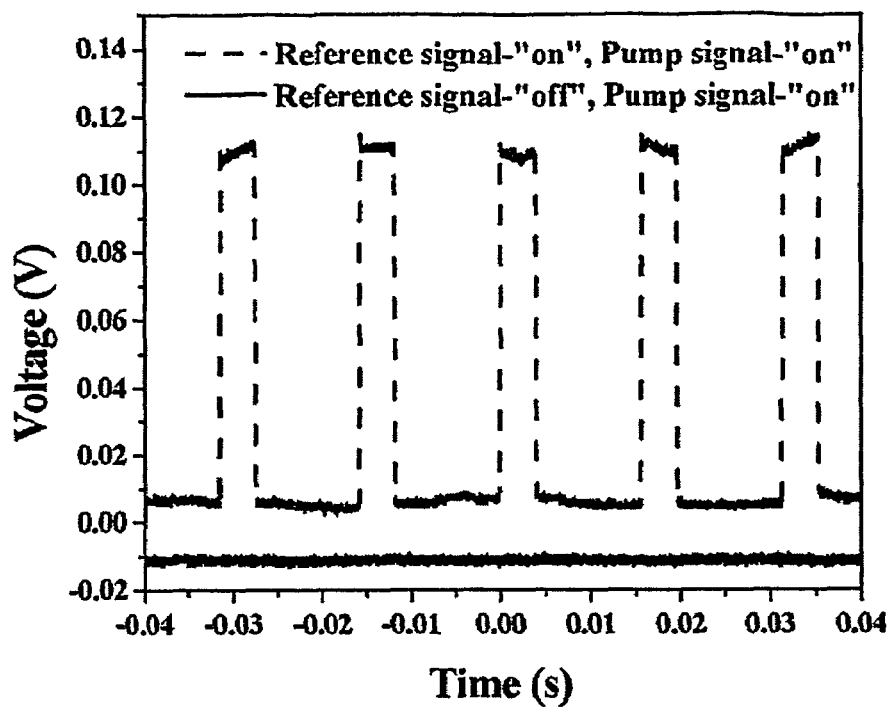
FIG. 3 shows oscillograms from photodetector measurements obtained from the apparatus of FIG. 2, wherein the dotted line shows infrared signal response on pump influence and the straight line shows measurements when reference signal was shutdown and at pumping action.

FIG. 3 shows oscillograms of the infrared reference signal response to the pump action. Full line trace at the bottom, corresponds to the situation where the reference signal was switched off while at same time the modulated pump was present. From the bottom trace one concludes that no stray light from the pump was detected by the infrared detector at the recorded sensitivity levels. The dashed line shows infrared signal response to the presence of the pump signal. As seen, 6-7-fold signal amplification was evidenced.

Figure 4:
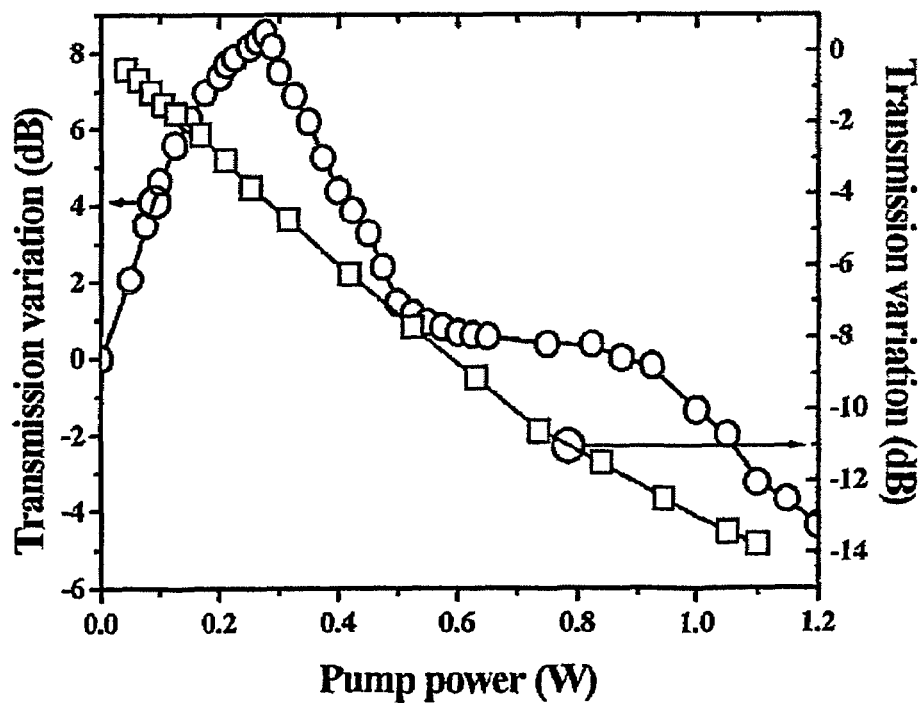
FIG. 4 is a graph showing the dependence of the infrared signal transmission through optically pumped SOI-based waveguides on the pump power, wherein circles indicate measurements taken with a gold-doped waveguide and squares indicate measurements taken in a sample without gold doping.

FIG. 4 shows transmission of the guided reference infrared signal as a function of pump power, for both, gold diffused and undiffused waveguide samples (the last data were taken from Reference [17]). We reported about last case in a previous article [17] that dealt with light attenuation by light in SOI-based waveguides. From comparison between two graphs, it can be seen that undiffused gold changes drastically the optical properties of the Silicon waveguides inducing optical amplification instead of induced absorption of the near infrared light. A maximum gain coefficient of 28 dB/cm was obtained at 0.3W pumping power. For pump powers of 0.8W and higher, attenuation was measured instead of amplification, suggesting that free-carrier absorption mechanisms prevailed. Another possibility for the reduction in gain factor at high pumping frequencies could be attributed to changes in energy level spacing generated by high temperature heating of the waveguides by the incident light [16]. From calculations that were presented in our previous work [17], free carrier absorption coefficient can be evaluated to be of about 35 dB/cm (data of the Reference [17] taking into account free carrier lifetime for gold-diffused silicon) at a free carrier concentration (about $10^{18}$ cm$^{-3}$) induced by 0.8W pump power in similar waveguide without gold. Thus, we can conclude, that observed amplification of the infrared optical signal is due to gold diffusion in the SOI-based waveguides.

In addition it should be noted, that we measured optical amplification in each gold-doped silicon sample that was manufactured at different diffusion process. The observed gain was ranged from 0.5 to 8.5 dB depending on the specific processing conditions. But dependence of the gain as function of diffusion temperature regime had similar trend with results of the Reference [14]. The best result, which was presented here, was obtained for sample that was manufactured by applying of following technology process: fast insertion into furnace at 650° C. and fast withdrawal of the sample after one-hour diffusion time. Weman, et al observed maximal luminescence intensity for 1.54-µm wavelength at the same diffusion temperature [14].

It should be noted that there may be additional pumping mechanisms in order to attain gain in an energy scheme where gold or other dopants are included. A very advantageous one would be pumping by current injection in a forwarded-biased p-n junction. Current injection is a common method to attain amplification in direct band-gap semiconductors.

B. Optical Amplification in Non-Homogeneously Heated Semiconductor Materials

B.1. Introduction

Laser action by homogenously heating of any material, as sole mechanism is not viable since both, Maxwell-Boltzmann and Fermi-Dirac energy level population laws prevent the attainment of population inversion at any finite temperature. On the other hand, laser action by purely thermal pumping is possible provided different temperature regimes are sustained in the material at different places. Perhaps the best example of purely thermally excited laser system is that of gas-dynamic lasers [18]. There, a mixture of gases are heated to temperatures of above 1000° C. and are transported into a colder area by letting it expand through a nozzle into a region of lower temperature. Downstream in the expansion process, regions are found where population inversion is created due to different lifetimes of the upper and lower lasing levels. Gas-dynamic $CO_2$ lasers of this type have produced very high power values. This scheme provides an example of a lasing system where the power for its activation is delivered purely by heating. No such an effect has been reported insofar for semiconductor or other solid-state material.

We report here the measurements of gain at near-infrared wavelengths (1.3 µm and 1.5 µm) by non-homogeneously heating of commercial-type silicon slabs. Due to the uniqueness of our findings, we attempted to attain gain using different means of heating, different irradiation geometries and different signal sources. We report also the achievement of gain in silicon waveguides of the silicon-on-insulator type.

B.2. Experimental Details and Results

In the reported experiments we tested two-side polished commercial-type silicon of n and p-types with different thickness and dope levels samples (suppliers: Motorola, SICO Wafer GmbH).

We took special care in order to minimize spurious effects, which can affect measurements of optical transmission while irradiating the samples with a heat or light source. The two prominent effects are: interference Etalon effects in the slab and thermal lensing effects. To minimize Etalon effects we carried out measurements at a Brewster angle and polarized the signal light in the TM direction. We also prepared samples with SiO anti-reflection coating at the measured wavelength range. Another approach we chose in order to diminish Etalon effects was to use a low coherent source, namely the spontaneous emission from an Erbium-Doped fiber. Mildly thermal focusing effects were observed occasionally but found to be minor as compared to the measured ones. In CW measurements we used a power meter with area much larger than the measured beams, and in pulsed experiments we used a lensed fast-response detector to gather light from a wide angular range.

As stated, we have encountered optical amplification in several situations comprising various heating means and geometric delivery schemes. We shall in the following describe briefly those schemes and report on gain attained.

B.2.a. Pulsed Laser Pumping

We expect laser and optical irradiation at photon-energies greater than the forbidden gap to differ from other heat delivery mechanisms, since here carriers are not only excited indirectly by thermally induced processes but also by direct generation via photo-absorption. At the wavelengths used for pumping here ($\lambda<1.1$ μm), most of the absorption is known to take place by band-to-band phonon assisted absorption [19]. This is a self-augmenting process, since the higher the temperature, the higher the absorption coefficient [19].

The scheme of edge power delivery is shown in FIG. 5B. A low power collimated near-infrared signal beam of about 1 mm diameter is directed close to the border of a silicon slab, perpendicularly to it. At the edge, a pulsed Nd-YAG laser ($\lambda=1.064$ μm), of power in the range of from 15 mJ to 145 mJ in single a pulse, was mildly focused. This laser beam functions as heat source or pump. Time duration of the pump pulse was about 50 μsec and the repetition rate was 5 pulses/sec. Amplification was measured for different near-infrared light signal sources, namely: 1.3-μm and 1.55-μm semiconductor lasers, spontaneous emission from erbium doped fiber (EDF), ($\lambda\sim1.55\pm0.1$ μm) and a ring laser that based on the EDF with spectral peak at 1.58 μm.

Figure 6:
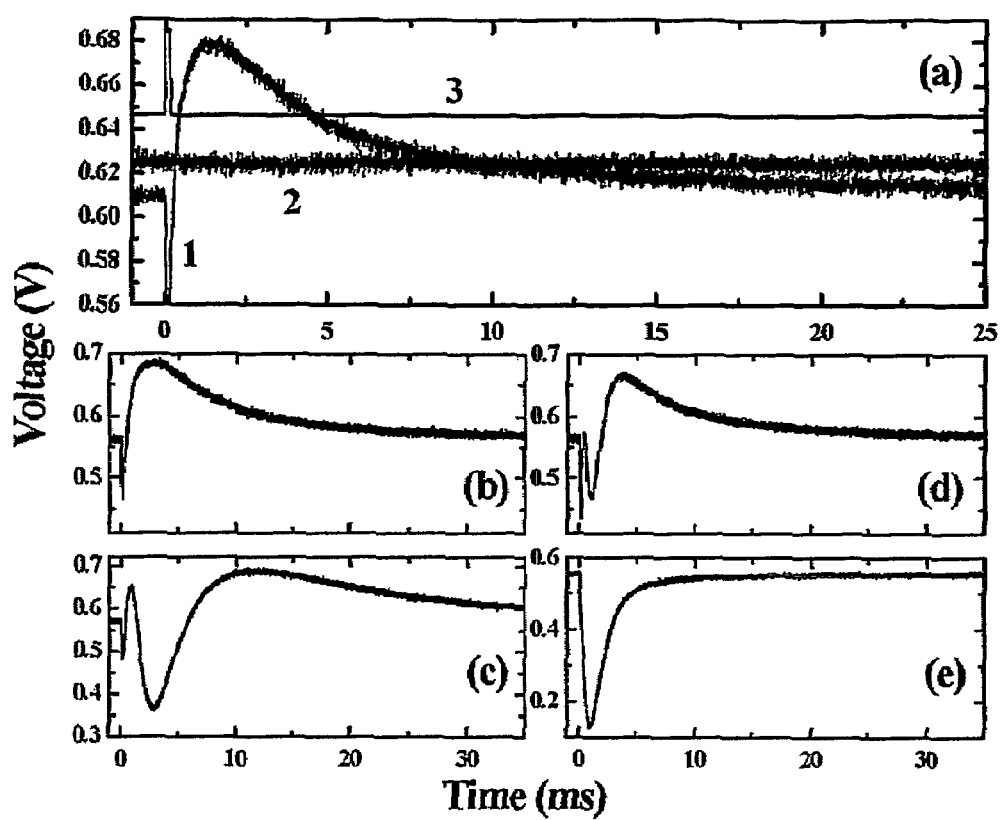

In the experiments we tested commercial two-side polished silicon samples of n and p-types with different thickness and dope levels. For elimination of any interference effects, we tested samples with SiO antireflective coating, and for uncoated samples low coherent spontaneous emission from EDF was used as optical signal. In FIG. 6(a) we see oscilloscope traces of the pump and signal pulses following the interaction. We observe here an 11 percent increase in the transmitted signal following the interaction. Comparing the maximum transmitted signal to the value of the signal incident to the sample, we get a gain ratio of about 9 percent. Another feature clear from FIG. 6(a) concerns the timescale of the response signal, which is in the millisecond regime. This points out that the process is temperature-dominated. The maximum value of the gain is attained after termination of the excitation pulse, and the total transient duration for this example is of about 30 msec. At a shorter time scale one observes a small transient decrease of signal (about 10 percent). This is also a common feature of almost all our experiments.

The decrease is attributed to absorption by free-carrier generation directly induced by the pump photons [17, 20, 21].

In FIGS. 7(a) and 7(b) we concentrate results of dependence of the optical gain as function of the excitation power for different samples and different signal sources. One notices here, that optical gain has low dependence on the sample's type (thickness and dope type), but there is a significant difference in the optical gain for samples with and without SiO antireflective coating. The marked influence of the coating on the gain attained is not entirely clear yet. We may attribute the effect to differences between thermal conductivity between the samples on interfaces (Si-Air vs. Si—SiO-Air respectively), the heat-transfer at the relevant temperature being of both radiative and non-radiative types. To confirm this hypothesis we conducted crude measurements of the temperature changes by means of a thermocouple at the backside of the sample that was heated by a continuous green laser. We evidenced that silicon with SiO coating is more rapidly heated and to higher temperatures as compared to bare silicon samples. We report also the observation of gain in uncoated samples tilted at Brewster's angle with respect of a laser beam with $\lambda=1.55$ μm wavelength.

Looking back at FIG. 7(a) one also observes a lower amplification value for a 1.31 μm-wavelength signal. Dependence of the optical gain on pump power for different samples is shown in FIG. 7(b). Here, we can see, that the gain was observed for both p and n-doped silicon samples. Another feature clear from FIG. 7(b) concerns the rising of the gain with increasing of the sample thickness. In another configuration, the pump beam was shined into the slab at the same side of that of the signal beam, forming a variable angle between the two beams (FIG. 5B). This configuration allowed monitoring easily the amount of overlapping between the two spots. The amount of spatial overlapping between the signal and pump beam was adjusted by varying the size of the pump spot and its lateral position. FIGS. 6(b)-6(e) show the transient response of the transmission following the excitation pulse for different focusing and mutual lateral positions of the signal and laser spots. In all cases the spot of the pump was smaller than the spot of the signal, i.e. the amount of energy delivered to the interaction region was constant. The transmission however shows drastically different character, changing from gain to loss while the focal spot is enlarged. As seen, some of the traces show both, loss and gain, while in some of the cases the gain precedes the loss and in other the order is inverted. This provides evidence that the distribution of the heating power is clue in the attainment of gain.

In the experiment we tested the one-plane power delivery scheme that shown in FIG. In the case, pump beam was We observed optical amplification, as well. The results were not appreciably varied from described here ones.

We point out in addition, that we did not observe optical amplification when Q-switch laser (with pulse duration of about 20 ns) was used as optical pumping.

B.2.b Quasi-Continuous and Continuous Laser Pumping.

In this case, the scheme of power delivery is similar to that shown in FIG. 5A. At the edge, a CW green laser beam ($\lambda=0.532$ μm) of power in the range of 0.5-5 Watt is mildly focused. The pump laser is chopped by a slotted wheel of 2% duty cycle, delivering pulses of trapezoidal shape in time. The duration of these quasi-CW pulses was in the range of 0.15-7 msecs and was controlled by the turning speed of the chopper.

In these experiments we observed a linear dependence of gain on the CW power and gain here reached up to a factor of two. In FIG. 8 we see the dependence of gain on irradiation time. It is observed that the gain increases with pulse length as expected from temperature-dependent effect.

Using the same geometrical configuration and the same sources we conducted measurements in a pure CW mode. We encountered gain here too and its value is shown as a dotted line in FIG. 8.

In addition, in the experiment we tested the one-plane power delivery scheme that was described in previous section and shown in FIG. 5B. We observed optical amplification, as well. The results were not appreciably varied from described here ones.

B.2.c. Optical Gain by Localized Microwave Heating of the Silicon Samples

Our first observations of gain were conducted using optical pumping at photon energies higher than the Si band-gap, as described in the sections above. Optically-induced stimulated emission in Si is a possibility, but the timing of the pulsed experiments, and the attainment of gain after completion of the pump pulse hinted clearly that thermal processes are involved. We choose to test this hypothesis by localized heating in a process where no direct photonic excitation of charge carriers is involved. A significant gain effect was observed for microwave spot-irradiation, evidencing that the attainment of gain was very likely due of thermal excitation since no optical process was involved here.

B.2.d. Luminescence Measurements

As in usual situations where gain is present, one expects to measure also exceptional effects of luminescent emission in the form of enhanced spontaneous emission or related effects. This means shutting down the signal source, and look at possible emission of radiation at the relevant wavelengths induced only by the pump source. First, we point out that in all the experimental situations described above, no voltage was observed at the signal detector when the signal source power was tuned off. We took special care in all our experiments to avoid any stray light from the pump to reach the signal detector. In order to detect luminescence induced by the pump source, we built a much more sensitive system: we gathered the light emitted by the sample into a multi-mode fiber by means of a converging lens. The fiber was connected to a Spectrum Analyzer (Ando model AQ-6315B), with a capability of measuring signals down to −70 dBm. We placed a Si sample of the same kind as the one described in Section B above (CW experiments), and also irradiate it with the same CW focused light source ($\lambda$=532 nm) from the backside of the sample. The induced luminescence spectra are shown in FIG. 9 for different power levels of irradiation. Several features are evident:

- The range of wavelengths where luminescence was prominent was the same as the one where gain was observed.
- The peak of luminescence for the relevant powers is far-away from the one predicted by Wien's law for pure blackbody radiation at the estimated temperatures (for T=1000° K., $\lambda_{max}$=2.9 µm).
- The shift in the wavelength of maximum luminescence is in opposite direction to the one predicted by Wien's displacement law. I.e. here we see peak displacement to longer wavelength with increasing delivery of power to the sample.
- The dependence of luminescence intensity on pump power is highly non-linear.

The spectral shifts with power can be attributed to the shrinking of band-gap with temperature and has been observed also in transmission experiments of uniformly heated semiconductors [19, 22]. We discuss this point further in the next section.

B.2.e. Gain Measurements in Optical Waveguides

We are currently performing experiments using waveguides of the silicon-on-insulator (SOI) type. Measurement setup was liked to optical scheme that was described in Section A.3. (see FIG. A.2.). This configuration is especially attractive since light is confined laterally in two dimensions and the spatial distribution of the optical field is accurately known. Insofar we have conducted experiments using both continuous and modulated laser sources. We have observed insofar transmission enhancement up to 50 percent in SOI waveguides following pump irradiation. We point out that gain was explicitly observed in these cases when the irradiation was displaced from the waveguides by several tenths of microns. FIG. 10 shows dependence of an infrared transmission response at 1.55 µm-wavelength on spatial position of the focused pump beam respect to waveguide. Here, it possible to see, that there is attenuation of the infrared signal, when pump beam direct illuminated the waveguide, and about 10% optical amplification was observed when focused beam spot was moved from the waveguide place. FIG. 11 shows dependence of the signal attenuation and amplification on duration of the pump pulse. Here, we obtained similar dependence of the optical amplification as function of pulse time in comparison with optical amplification in bulk silicon (see FIG. 8).

It should be note, that we measured optical amplification in Gold doped silicon waveguides when pump spot was removed from waveguide position on tens microns, as well. It seems therefore that in the case of gold-doped waveguides both effects were present, namely direct optical excitation and localized heating.

B.2.f. Gain Measurements at Ohmic Contact Heating

FIGS. 12A and 12B show experimental setups for the measurement of optical amplification in non-homogeneous heated silicon samples by heating of Ohmic contacts by electrical current. We used Cr as material for contacts, which was sputtered on silicon. Thickness of the Cr-layer was about 300 nm. 60W DC electrical power supply was connected to the resistor.

In the experiments we measured a few percent of optical amplification.

B.2.f Further Methods for Attaining Gain by Inhomogeneous Heating.

One can think about other methods for attaining gain by the mechanism described here. Among others: heating by a non-coherent light source like a incandescent infrared lamp, halogen lamp, flash lamp or concentrated sunlight, heating by radio-frequency source, by an electron beam etc.

Gain Enhancement Schemes

Several gain enhancement schemes which are applied to other situations where optical amplification is observed can be applied here too. Worth mentioning is the option of allowing the signal beam to pass more than once through the amplifier medium. This can be achieved by the use of external mirrors or incorporating reflecting surfaces by coating the semiconductor surfaces with a reflecting dielectric or metallic coating. If in such a situation the small-signal gain is equal or larger than the total loss, laser action will take place.

B.3. Hypothesis

The following discussion of possible physical mechanisms for the operation of the present invention are offered merely to facilitate understanding. It should be appreciated, however, that the accuracy or otherwise of the proposed mechanisms is inconsequential in view of the observed result that the invention is operative to produce optical amplification. The following discussion should therefore not be construed in any way to limit the scope of the present invention as defined in the appended claims.

As stated in the introduction, at this point we have no quantitative model to explain our findings. We concentrated our efforts in gathering a considerable amount of data from diverse situations, all having in common the fact that power was delivered into Si slabs or waveguides in a non-uniform way. Following all these findings we conjectured an explanation for these results based on the following main points:

a. Local bending of energy bands due to non-homogeneous heating of a semiconductor slab.
b. Transfer of charge carriers between the hot spot and neighboring regions creating areas where the carriers' distribution is non-thermal (lower temperature), i.e. population inversion is enabled. Several mechanisms affecting the transport of carriers are expected in these situations and are discussed below.

A scheme of the proposed model can be found in FIGS. 13(A) and 13(B). FIG. 13(A) schematically shows energy states deformation in local heated semiconductor material.

They are shown as discrete states for illustration purposes. Distribution of intrinsic and nonequilibrium carrier densities for the case are shown in FIG. 13(B).

We discuss now in some detail the mechanisms listed. First, the narrowing of band gap with temperature is well known [23], and is described properly by the following expression:

$$E_g(T) = E_g(0) - \frac{\alpha \cdot T^2}{T + \beta} \quad (1)$$

where $E_g(0)=1.17$ eV is the band gap value at 0° K., $\alpha=4.73\times 10^{-4}$, and $\beta=635$ [23]. Translating it to our situation this means that an energy gap corresponding to emission/absorption wavelengths of 1.3-μm and 1.55-μm, will correspond to heating temperatures of about 800° K. and 1100° K. respectively. A direct measurement of temperature under spot laser irradiation is not simple. We attempted although, estimation based on an approximate expression of continuous heating a semi-infinite material with a Gaussian laser beam [24]:

$$T = \frac{P_{opt} d \sqrt{\pi}}{2K} \quad (2)$$

Where, $P_{opt}$ is the absorbed pump power per unit area, d is Gaussian radius of the pumping spot, and K is silicon's thermal conductivity. This estimation took us to the expected temperature range.

Our next consideration is about the nature of the measured light emission. As well known, radiative carriers recombination in Si can be realized by two mechanisms, namely, recombination via carrier traps within the forbidden gap or mediated by phonon emission or absorption. Regarding the first possibility, we used commercial standard samples with a low concentration of impurities. Dislocations and other deformations are also known to enhance emission at the wavelength range of interest [10]. For example, Sauer et al. [10] studied and measured spectral data in the mid-infrared 1.1 μm<λ<1.7 μm on samples where dislocations where caused systematically by deformations and inclusions. Here, we did not introduce any impurities in silicon samples and did not deform intentionally the samples before our experiments. We cannot rule out however the possibility that we introduced temporary strains in the sample during laser illumination or heating, and that these defects had a role in enabling transitions. The second radiative process to be considered is band-to-band carrier recombination mediated by absorption or emission of phonons. Attainment of gain under these processes was predicted many years ago [5]. Absorption and emission of near IR radiation in clean homogeneously heated samples have been intensively studied ([19, 23, 25]. The data reported was satisfactorily explained by phonon mediated process and in all cases it was concluded that at higher temperature optical activity was greatly enhanced by gap narrowing, free carrier generation and phonon generation. At this point we are inclined to attribute the measured gain and luminescence spectra to last effect, although we are aware that considerable lattice deformations are present during the non-homogeneous heating that would facilitate band-to-band recombination.

The most essential question in the understanding of the gain effects observed is about the mechanism responsible for population inversion and gain. On a first glance the band bending picture (FIG. 13(A)) due to spot heating resembles the one encountered in semiconductor double hetero-structure lasers, where a region of material with small energy gap is sandwiched between two regions with higher gap values. But contrarily to that case, here most of the free-carriers are generated at the central portion of the structure. The dynamics of the free carriers will determine whether or not population inversion conditions would be attained. We can list here several processes responsible for the dynamics of carriers.

1. Diffusion of carriers from the center outbound. The carrier concentration in Si is a very pronounced function of temperature. Heating from 600° K. to 1000° K. amounts an increase in about 2 orders of magnitude in carrier concentration. Thus, temperature gradients are accompanied by large concentration gradients, promoting diffusion into the colder regions (FIG. 13(A), direction 1). This process by itself would generate carrier concentrations (both electrons and holes) at the outer regions much larger than dictated by Fermi-Dirac statistics in homogeneous heating.

2. Spatial charge generation. The concentration imbalance created by the diffusion process will generate space charge due to differences in electron and holes effective masses and lifetimes. The space-charge generates electrostatic fields opposing diffusion.

3. Level bending forces. The bending of energy levels causes potential gradients equivalent to static forces that drive the carriers into the bottom of the potential wells (FIG. 13(A), direction 2).

Another way to look at the possible attainment of population-inversion is by considering the density of states function in semiconductors. Although this is a fact already implicit in the discussion of carrier density, it facilitates the analogy with other laser systems. The density of states interacting with a photon of energy hv is a strongly rising function of the difference $E_G$–hv). This is a common feature for all semiconductors. In the situation we encounter here this fact has special relevance: the central hot spot has both a higher density of levels and a higher degree of level occupancy as compared to neighboring regions at the same energy. Thus it may be viewed as a population reservoir in close interaction with displaced radiating levels, and serve a supply of carriers to the neighboring regions.

In conclusion we have presented evidences of the attainment of gain in silicon by non-homogeneous heating of the material. Gain was attained both at continuous and pulsed energy delivery, in a variety of heating configurations using different sources and pumps. We have also proposed a mechanism responsible for the attainment of gain observed, based on energy band bending by temperature inhomogeneity, and dynamics of charge carriers under this condition. We expect that further research presently taking place in our group will consolidate further our understanding of these findings and eventually deliver additional lasing schemes.

REFERENCES

1 W. Eisfeld, U. Werling, and W. Prettl, Appl. Phys. Lett. 42, 276-278 (1983).
2 L. Pavesi, Proceedings of Spie 4997, 206-220 (2003).
3 L. Canham, *Nature.* 408, 411-412 (2000).
4 Atanackovic, B. Petar, Marshall, R. Larry, "Devices with optical gain in silicon", United States Patent Application 20020048289, (2002).
5 N. G. Basov, O. N. Krokhin, and Yu. M. Popov, *Sov. Phys. JETP* 13, 845 (1961).
6 T. Trupke, M. A. Green, and P. Wurfel, J. Appl. Phys. 93, 9058-9061 (2003).

7 Hak-Seung Han, Se-Young Seo, Shin J H, Namkyoo Park., Appl. Phys. Lett. 81, 3720-3722 (2002).

8 R. Claps, D. Dimitropoulos, B. Jalali, Electron. Lett. 38, 1352 (2002).

9 L. C. Khoo, R Normandin, Appl. Phys. Lett. 52, 525 (1988).

10 R. Sauer, J. Weber, J. Stolz, E. R. Webek, K.-H. Küsters, and H. Alexander, Appl. Phys. A, 36, 1-13 (1985).

11 *Radiation damage and defects in semiconductors*: proceedings of the International Conference organized by the Institute of physics, held at the University of reading, 1972.

12 J. I. Pankove, and J. E. Berkeyheiser, Appl. Phys. Lett. 37, 705-706 (1980).

13 J. Mazzaschi, J. C. Brabant, B. Brousseau, J. Barrau, M. Brousseau, F. Voillot, and P. Bacuvier, Solid State Communications, 39, 1091-1092 (1981).

14 H. Weman, A. Henry, T. Begum, B. Monemar, O. O. Awadelkarim, and J. L. Lindström, J. Appl. Phys. 65, 137-145 (1989).

15 N. Q. Vinh, T. Gregorkiewicz, and K. Thonke, Phys. Rev. B 65, 033202-1-033202-4 (2001).

16 S. M. Sze, *Physics of Semiconductor Devices*, 2nd ed. (New York: Wiley, 1981).

17 S. Stepanov, and S. Ruschin, Appl. Phys. Lett. 83, 5151-5153 (2003).

18 S. A. Losev, *Gasdynamic Lasers*, (Springer-Verlag Berlin, 1981).

19 P. J. Timans, *J. Appl. Phys.*, 74, 6353 (1993).

20 R. A. Soref and J. P. Lorenzo, *Technical Digest Series* 4, 86 (1989).

21 R. Normandin, D. C. Houghton, M. Simard-Normandin, and Y. Zhang, *Can. J. Phys.* 66, 833 (1988).

22 V. Alex, S. Finkbeiner, J. Weber, *J. Appl. Phys.*, 79, 6943 (1996).

23 J. C. Sturm, C. M. Reaves, *IEEE Trans. On Electron Devices* 39, 81 (1992).

24 J. F. Ready, *Effect of high-power laser radiation*, (Academic Press, 1971).

25 G. E. Jellison, Jr. Lowndes, D. H. Lowndes, *Appl. Phys. Lett.* 47, 594 (1982).

What is claimed is:

1. A method for achieving optical amplification of an optical signal passing through indirect-gap semiconductor, the method comprising the steps of:
   (a) providing a body of the indirect-gap semiconductor doped with at least one element so as to generate at least one added energy level at a known energy lying within the energy band-gap of the semiconductor, said added energy level enabling an energy transition between said added energy level and an energy band of the semiconductor corresponding to generation of a photon of a given wavelength, wherein said indirect-gap semiconductor is silicon, and wherein said at least one element is chosen from the group comprising: Gold, Silver, Platinum, Iron, Copper, Zinc, Cobalt, Tellurium, Mercury, Nickel, Sulfur and Manganese; and
   (b) irradiating a target region of said body of semiconductor with optical illumination of a wavelength shorter than said given wavelength in such a manner as to cause population inversion of charge carriers within the target region, thereby causing amplification of an optical signal of said given wavelength within said target region.

2. The method of claim 1, wherein said illumination has a wavelength no greater than a wavelength of a photon corresponding to the transition between the conduction gap and the valence band in said semiconductor.

3. The method of claim 1, wherein said at least one element is chosen from the group comprising: Gold, Silver and Platinum.

4. The method of claim 1, wherein said at least one element includes Gold.

5. The method of claim 4, wherein said given wavelength is in the range of 1.2-2.2 micrometers.

6. The method of claim 1, wherein said irradiating is performed using a pulsed laser source.

7. The method of claim 1, wherein said irradiating is performed using a substantially continuously irradiating laser source.

8. The method of claim 1, wherein said target region lies at least partially in an optical waveguide formed in said body of semiconductor.

9. An apparatus for achieving optical amplification of an optical signal of a given wavelength within a target region of an indirect-gap semiconductor, the apparatus comprising:
   (a) a body of the indirect-gap semiconductor doped with at least one element so as to generate at least one added energy level at a known energy lying within the energy band-gap of the semiconductor, said added energy level enabling an energy transition between said added energy level and an energy band of the semiconductor corresponding to generation of a photon of the given wavelength, wherein said indirect-gap semiconductor is silicon, and wherein said at least one element is chosen from the group comprising: Gold, Silver, Platinum, Iron, Copper, Zinc, Cobalt, Tellurium, Mercury, Nickel, Sulfur and Manganese;
   (b) an irradiating arrangement configured to generate optical illumination of a wavelength shorter than said given wavelength and deployed for irradiating a target region of said body of semiconductor with said optical illumination in such a manner as to generate population inversion of charge carriers within the target region, thereby causing amplification of an optical signal of said given wavelength within said target region.

10. The apparatus of claim 9, wherein said illumination has a wavelength no greater than a wavelength of a photon corresponding to the transition between the conduction gap and the valence band in said semiconductor.

11. The apparatus of claim 9, wherein said at least one element is chosen from the group comprising: Gold, Silver and Platinum.

12. The apparatus of claim 9, wherein said at least one element includes Gold.

13. The apparatus of claim 12, wherein said given wavelength is in the range of 1.2-2.2 micrometers.

14. The apparatus of claim 9, wherein said irradiating is performed using a pulsed laser source.

15. The apparatus of claim 9, wherein said irradiating is performed using a substantially continuously irradiating laser source.

16. The apparatus of claim 9, wherein said target region lies at least partially in an optical waveguide formed in said body of semiconductor.

17. A method for achieving optical amplification of an optical signal passing through an indirect-gap semiconductor, the method comprising the steps of:
   (a) providing a body of the indirect-gap semiconductor doped with at least one element so as to generate at least one added energy level at a known energy lying within the energy band-gap of the semiconductor, said added energy level enabling an energy transition between said added energy level and an energy band of the semiconductor corresponding to generation of a photon of a given wavelength, wherein said at least one element is non-isoelectronic with atoms of said indirect-gap semiconductor; and (b) irradiating a target region of said body of semiconductor with optical illumination of a wavelength shorter than said given wavelength in such a manner as to cause population inversion of charge carriers within the target region, thereby causing amplification of an optical signal of said given wavelength within said target region.

18. The method of claim 17, wherein said illumination has a wavelength no greater than a wavelength of a photon corresponding to the transition between the conduction gap and the valence band in said semiconductor.

19. The method of claim 17, wherein said given wavelength is in the range of 1.2-2.2 micrometers.

20. The method of claim 17, wherein said target region lies at least partially in an optical waveguide formed in said body of semiconductor.

* * * * *